United States Patent [19]

Brown

[11] 4,228,367
[45] Oct. 14, 1980

[54] HIGH SPEED INTEGRATED SWITCHING CIRCUIT FOR ANALOG SIGNALS

[75] Inventor: Paul M. Jr. Brown, Morgan Hill, Calif.

[73] Assignee: Precision Monolithics, Inc., Santa Clara, Calif.

[21] Appl. No.: 931,672

[22] Filed: Aug. 7, 1978

[51] Int. Cl.³ .......................................... H03K 17/687
[52] U.S. Cl. .................................. 307/251; 307/246
[58] Field of Search ........................ 307/251, 304, 246

[56] References Cited

U.S. PATENT DOCUMENTS

| | | | |
|---|---|---|---|
| 3,610,953 | 10/1971 | Gordon et al. | 307/251 X |
| 3,902,078 | 8/1975 | Peterson | 307/251 |
| 3,916,222 | 10/1975 | Compton | 307/251 |
| 4,042,836 | 8/1977 | Compton et al. | 307/251 |
| 4,103,186 | 7/1978 | Albarran et al. | 307/251 |

*Primary Examiner*—John S. Heyman
*Attorney, Agent, or Firm*—Poms, Smith, Lande & Rose

[57] ABSTRACT

A high current capacity junction field effect transistor, or JFET, is provided with certain special circuitry so that it may be rapidly switched on and off, and is protected against fault currents. The gate electrode of the large switch JFET is controlled by a circuit including four additional JFET's of somewhat smaller size, arranged in two pairs, with a transistor interconnecting one of the pairs of JFET's. The first pair of JFET's permits the rapid charging of the sizable gate capacitance of the switch JFET as it is being turned off, with the second series connected pair of JFET's of smaller current carrying capacity serving to continue the current flow, and maintain the gate electrode of the switch JFET at the desired "pinch-off" voltage. When the switch JFET is being turned on, the transistor is initially energized by the differing current capacities of the two transistors making up the second, current limiting air of JFET's mentioned above, to rapidly discharge the large switch JFET capacitance. Fault protection for the switching circuit is achieved by various techniques including the use of a current limiting JFET, and other components placed to block heavy fault currents which could otherwise occur when the analog voltage applied to the source and drain electrodes of the large JFET exceed the potentials of the positive and negative power supplies of the integrated circuit.

9 Claims, 4 Drawing Figures

SWITCH TURNING OFF

SWITCH TURNING ON

ALL CURRENTS ARE TRANSIENT

UNPROTECTED CIRCUIT FAULT MODE CURRENTS

HIGH SPEED INTEGRATED SWITCHING CIRCUIT FOR ANALOG SIGNALS

FIELD OF THE INVENTION

This invention relates to high current analog switches using integrated circuits, and more particularly to circuits for economically increasing the speed operation of such circuits and for protecting against undesired heavy fault currents.

BACKGROUND OF THE INVENTION

Junction field effect transistors have many desirable properties which are useful in switching applications. However, the relatively high capacitance associated with large junction field effect transistors has limited their usefulness for high speed switching applications.

Accordingly, a principal object of the present invention is to increase the turn-on and turn-off speeds of large size junction field effect transistor switches, without the need for large idle currents present in the switching or control circuitry for the big switch JFET.

In integrated circuits, when a junction field effect transistor is used as a switch, and an analog voltage is applied across the source and drain electrodes of the JFET to be switched, there is a significant danger that heavy fault currents will flow, in the event that the signals applied to either the source or the drain electrode of the switch JFET exceed the positive or the negative supply voltages. Accordingly, another important object of the present invention is to prevent the flow of heavy fault currents when such voltages are applied to the source or drain electrodes of the big switch JFET.

SUMMARY OF THE INVENTION

In accordance with the present invention, a very large switch junction field effect transistor, or JFET, may be rapidly switched on and off, without drawing large idle or control currents when the switch JFET is on or off. In addition, special fault control circuits are provided for preventing the flow of heavy fault currents when the signals to be switched exceed the normal rated signals to be applied to the switch terminals of the JFET, namely to the source and drain electrodes.

In accordance with a broad aspect of the invention the gate electrode of the large switching JFET is provided with a large current capacity semiconductor circuit for charging the gate capacitance of said switch JFET rapidly, and a lower current capacity control circuit in series with said first control circuit for maintaining the gate electrode of the switching JFET more than a "pinch-off" voltage beyond the normal source electrode voltage of the switching JFET.

A collateral more specific aspect of the invention involves the control circuitry for the gate electrode of the switching JFET which may include a first pair of high-current capacity JFET's and a second pair of lower capacity JFET's, with a transitor connected between the unequal JFET's of said second pair. When the switch JFET is being turned off, the first pair of JFET's in the control circuits rapidly charges the high gate capacitance of the switching JFET, and the second pair of JFET's which are connected in series with the first pair, maintain the potential of the gate electrode at or beyond the "pinch-off" voltage level, and reduce current flow following the initial current surge, to a modest level. When the switching JFET is being turned on, its large gate capacitance is initially discharged rapidly through the transistor, and then the smaller of the JFET's continues to hold the gate electrode substantially at the potential of its source electrode.

Another aspect of the invention involves the use of a unity gain buffer circuit that is employed in the circuitry for maintaining the gate and source electrodes of the switching JFET at substantially the same potential.

In accordance with an additional feature of the invention, the unity gain buffer may include an additional pair of JFET's which are identical with one another, and which are connected between the positive and the negative voltage supplies, with the gate electrode of one of the JFET's in the buffer circuit being connected to the source electrode of the switching JFET. With the two JFET's in the buffer circuit being identical and being connected in series, a fixed voltage drop, provided by a diode, for example, may be included in the gate-to-source circuit of one of the JFET's, and then an identical gate-to-source voltage drop is present in the second JFET which is its gate electrode connected to the source electrode of the large switching JFET. In this way, the gate electrode of this second JFET in the buffer circuit is maintained at a potential close to that of the source electrode of the switching JFET, and this potential is applied to the gate electrode of the large switching JFET, through a transistor that equalizes voltage drops, so that the gate and source electrodes of the switching JFET are held at substantially the same potential.

In integrated circuits of the present type, a positive voltage supply of +15 volts is normally provided and connected to the integrated circuit by an aluminum conducting bus. A negative voltage supply of −15 volts is characteristically or conventionally applied to the substrate of the integrated circuit. The signals applied to the switching electrodes of the large switch JFET are rated to be maintained between plus and minus 10 volts, well within the supply voltages of plus and minus 15 volts. When the voltages applied to the switching contacts of the large JFET exceed the +15 volt value of the positive supply or drop below the −15 volt level of the negative supply, the normally back-biased protective diodes which are present in the integrated circuit between the substrate and adjacent semiconductive material in one of the transistors or JFET's, may be reversed and become forward biased. Heavy fault currents can flow as a result of this and other similar phenomena.

In accordance with additional features of the present invention the circuit has been designed to avoid damage or destruction by preventing the flow of heavy fault currents of the type mentioned hereinabove.

More specifically, if the source electrode of the large switching transistor were to have a negative voltage of a greater magnitude than the −15 volts applied to the substrate, the gate electrode of one of the JFET's in the buffer circuit would have this high negative potential applied to it in view of its connection directly to the source electrode of the switching JFET. With the JFET being of the positive type, and having its gate electrode more negative than the substrate, the diode between the negative type epitaxial layer and the positive substrate would be forward biased, and heavy potentially damaging fault currents would flow. In accordance with a further feature of the invention, an additional JFET may be connected between the source electrode of the large switching JFET and the gate control electrode of the JFET in the buffer circuit connected to act as a resistance, thereby limiting fault current flow.

Now, considering the situation when the source or drain electrodes of the large switching JFET become more positive than the positive voltage supply. Under these conditions, the source-to-gate diode or the drain-to-gate diode may be come forward biased in the large switching JFET and the large positive potential may be applied to the control transistor mentioned above. Under these circumstances, large fault currents may flow through the transistor to the positive voltage bus, potentially of such magnitude as to destroy the integrated circuit.

In accordance with another aspect of the invention, in addition to the recognition of these fault paths, protective diodes are provided in the various fault current paths of the control transistor which is connected to the gate electrode of the switch JFET, thereby protecting against the problem.

Other objects features, and advantages of the invention will become apparent from a consideration of the following detailed description and from the accompanying drawings.

DETAILED DESCRIPTION

Figure 1:
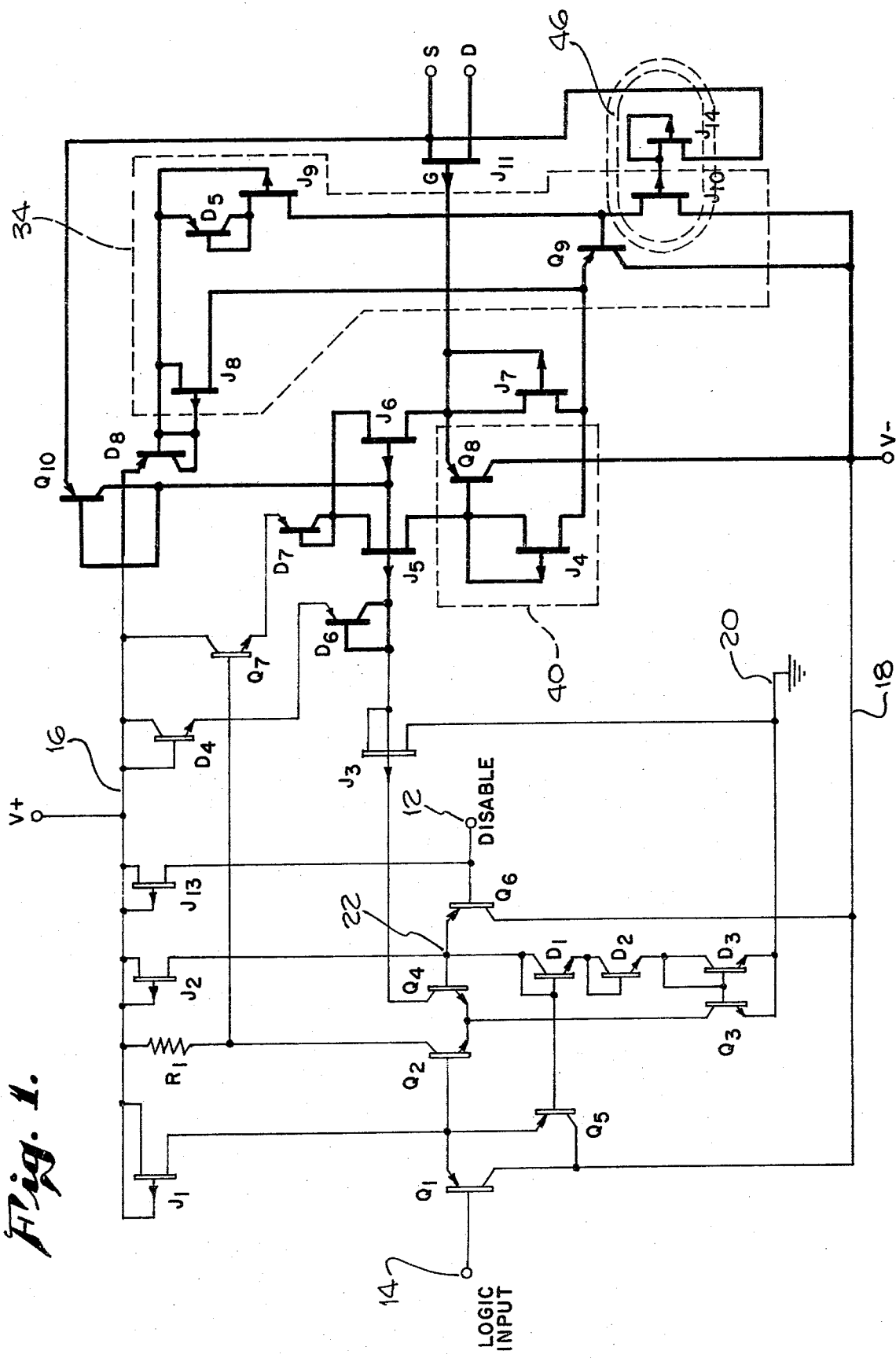
FIG. 1 shows a complete circuit diagram illustrating the principles of the present invention.

Concerning FIG. 1, before going into all of the circuit details, certain major features in the general outline of the circuit will be discussed. First, the circuit is an integrated circuit, and normally about four of the circuits as shown in FIG. 1 are mounted on a single chip. The main switching Junction Field Effect Transistor, or JFET, J11, is an unusually large JFET and has a current capacity, or IDSS, of 17 milliamperes. In operation, the source and drain electrodes, designated "S" and "D" in FIG. 1 are interconnected when suitable logic inputs are supplied to the disable input 12 and the logic input 14 as shown in FIG. 1.

Normally, Junction Field Effect Transistors are somewhat smaller than the Junction Field Effect Transistors J11 employed in the illustrative circuit of FIG. 1. Also, the problem of delay in turning the JFET's on and off has limited their use to a very significant extent. In the present case, special circuitry is provided as discussed in detail below to both turn on the switch JFET J11 rapidly and also to turn it off rapidly without requiring large idle or control currents. In addition, certain special fault prevention circuitry is included in the circuit of FIG. 1, as will also be discussed in detail below.

Continuing with certain general comments about the present illustrative circuit, in the specific integrated circuit of FIG. 1, a positive supply voltage of 15 volts is supplied to an aluminum bius designated 16 in FIG. 1. The entire integrated circuit is formed or created on a p-type silicon wafer, and the substrate is connected to the negative power supply, as indicated by the reference numeral 18 in FIG. 1. Ground is designated by the reference numeral 20 in FIG. 1. To give an indication of the order of magnitude of the voltages which would be employed in the circuit of FIG. 1, the positive and negative voltage supplies would be +15 volts and −15 volts. The specifications for the circuit permit voltages from +10 volts to −10 volts to be applied as signals to the source or drain electrodes of the large switch transistor J11. The logic inputs to the disable input terminal 12 and to the logic input terminal 14 are conventional TTL positive logic signals which are nominally 0 and 5 volts.

In the circuit of FIG. 1, the junction field effect transistors are designated by the letter "J", the transistors which are operated as such are designated by the letter "Q", resistors are designated by the letter "R" and transistors which are connected as diodes with the base and collector connected together, are designated by the letter "D". Incidentally, a current text which gives good background on this type of integrated circuits is "Analysis and Design of Analogue Integrated Circuits", by Paul R. Gray and Robert G. Meyer, John Wiley and Sons, New York, Santa Barbara, 1977. Of particular interest in FIG. 2.38b on page 112 of that text which shows an "ion-implanted JFET structure", of the type employed in one illustrative actual implementation of the present circuitry.

With regard to FIG. 1, it may also be noted that circuitry is divided into two portions, with one portion to the left being drawn with lighter weight ink lines and the portion to the right being drawn with heavier weight ink lines. This shading distinguishes the more conventional circuitry to the left from the circuitry illustrating the principles of the invention which appears to the right in FIG. 1. Also, ceratain circuits which operate together, or which are physically located adjacent one another in the same portion of the integrated circuit structure, are encircled by dashed lines in FIG. 1, as discussed in detail below.

Now, to start the more specific detailed description, with reference to FIG. 1, when a logic "0" is applied to the disable input at the base of transistor Q6, Q6 is turned on, the circuit is disabled and the switch between the source and drain electrodes of the large switch JFET J11 is open regardless of the logic input applied to terminal 14. However, if the disabled input terminal 12 is held at a logic "1" or is allowed to be open, control of the switch JFET J11 will depend on the logic input applied to terminal 14. In connection with the input logic, it is useful to note that the diodes D1, D2, and D3 provide a three diode drops of about 0.7 volts each to the point 22 so that when a logic "1" is applied to the disable input 12, the base-to-emitter junction is reverse biased and transistor Q6 is turned off.

Assuming that a logic "1" is applied to the disable input, so that the circuit is not disabled, control shifts to the logic input at terminal 14, as mentioned above. With a "0" logic input applied at terminal 14, transistor Q1 is on, transistor Q5 is off, and in the differential pair made up of transistors Q2 and Q4, transistor Q2 is of and transistor Q4 is on. The base of transistor Q7 is held close to the positive voltage supply level on bus 16, through resistor R1. There is substantially 0 voltage between the gate and source electrodes of both of the junction field effect transistors J5 and J6, and they can conduct their full rated drain-to-source saturation current (hereinafter referred to as IDSS) until their drain circuit nodes are charged, as best indicated by the dashed line and associated arrows 24 and 26 in the partial circuit diagram of FIG. 2. Incidentally, FIG. 2 is the circuit showing the transient and steady state currents which flow as the switch J11 is turned off and during the turn-off state.

The relative values of the large switch JFET J11, the pair of JFET's J5 and J6 which are most important in carrying the transient current required for rapid turn-off, and the smaller different size JFET's J4 and J7, are important to the mode of operation of the present circuit. The saturation current with 0 volts source-to-gate voltage for these JFET's is as follows: J11, approximately 17 milliamperes; J5 and J6, approximately 3.2 milliamperes each; J7, approximately 100 microamperes; and J4, 400 microamperes. In considering the foregoing figures, it may be noted that the very large switch JFET, J11 is about 5 times larger than each of the JFET's J5 and J6, and that the additional pair of JFET's J7 and J4 are much smaller, and J4 is several times larger than J7. Incidentally, the switch JFET J11 is several times larger than those presently on the market for similar purposes.

Figure 2:
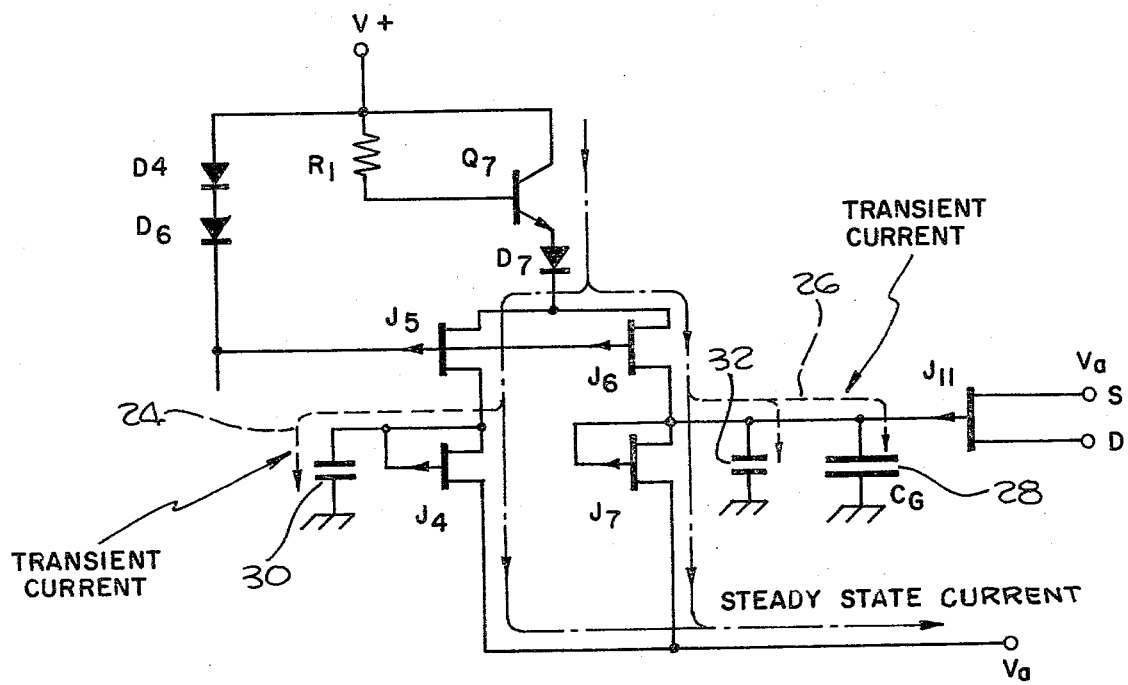
FIG. 2 is a pattial circuit diagram focusing attention on the turn-on of the principal switching JFET.

Following the initial rapid charging of the sizable gate capacitance Cg of JFET J11, designated by the reference numeral 28 in FIG. 2, as well as the other stray capacitances 30 and 32, the current through J5 and J6 is restricted to the much smaller IDSS current levels which flow through J4 and J7 on a steady state basis. Accordingly, the drain-to-source voltages of J5 and J6 is only a few hundred millivolts. The gate of the large switch transistor J11 is now held at a potential that is more than a "pinch-off" voltage greater than the maximum analog which will appear on the source of J11 under normal operation conditions. More specifically, as mentioned above, the positive voltage supply is about $+15$ volts, and the voltage range which is allowed to be applied under normal operating conditions to the source and drain electrodes of J11 is $+10$ to $-10$ volts. The voltage drop required to "pinch-off" current in a JFET is normally about 2 volts. Accordingly, with the gate electrode of J11 within a volt or two of $+15$ volts, and not more than $+10$ volts being applied to the source electrode of J11, it is in the "off" state, and the switch is open. Also, the base and emitter electrodes of the transistor Q8 are at the same potential, keeping it turned off.

Summarizing the operation of the circuit in the "switch-on" to "switch-off" transition, it is improved over prior circuits because it allows the JFET's J5 and J6 to conduct their large IDSS in the off transition only and to conduct a minimum stand-by current in the steady state "off" condition, as limited by the series connected smaller JFET's J4 and J7. This action allows the circuit to charge the sizable gate capacitance of the large switch JFET J11 quickly without idling a large current while the switch is off.

As the first step in considering the mode of operation of the circuit when the switch is being turned on, it may be noted that the circuit enclosed in the dashed line block 34 as shown in FIG. 1, including the JFET's J8, J9, J10, diode D5 and transistor Q9, form a unity gain buffer, with the voltage on the emitter of transistor Q9 always being equal to the voltage on the source electrode of the JFET J11, whether the switch is on or off. To verify that this is the case, it may be noted that J9 and J10 are identical JFET's and have their currents in series. With the operating conditions of J9 and J10 being identical and with the source-to-gate voltage of J9 being established as equal to one diode drop by the presence of D5, the source-to-gate voltage drop of J10 will be the identical one diode voltage drop (or about 0.7 volts). Accordingly, the base of transistor Q9 is one diode drop from that of the source electrode of JFET J11, and this is made up by the voltage drop from emitter to base of transistor Q9 so that the emitter of transistor Q9 is held at a potential substantially equal to that of the source electrode of JFET J11. The unity gain buffer 34 therefore has as its output the emitter of transistor Q9 which follows the source electrode of JFET J11.

When a logic "1" is applied to the logic input 14 at the far left of FIG. 1, transistor Q2 is turned on and the other transistor Q4 of the differential pair is turned off. The collector current for transistor Q3 now flows from the positive voltage supply bus 16 through resistor R1 and transistor Q2, dropping a voltage greater than a "pinch-off" voltage across resistor R1. The gate electrodes of JFET's J5 and J6 are now more than a "pinch-off" voltage above their source electrodes, and these JFET's J5 and J6 are turned off.

Figure 3:
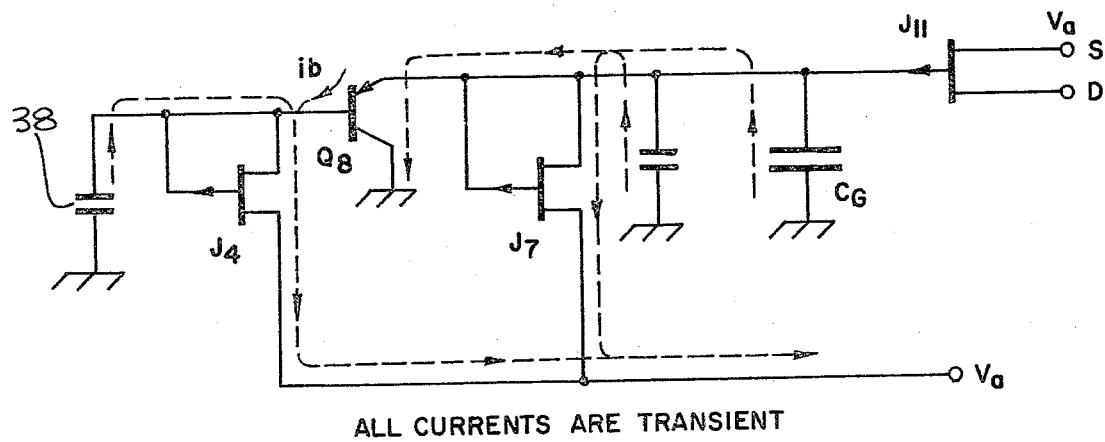
FIG. 3 is a partial circuit diagram focusing on the turn-off phase of the switching JFET.

The JFET J4, however, continues to conduct its IDSS, thus discharging the base electrode of transistor Q8 toward the buffer output voltage that appears on the emitter electrode of transistor Q9. The smaller JFET J7 also continues to conduct its IDSS, which is much less than that of JFET J4, discharging the gate node of the switch JFET J11 toward the buffer output voltage. Because the JFET J4 is several times larger than the JFET J7, it will very rapidly discharge the base electrode of transistor Q8 to a potential sufficiently lower than the emitter electrode of this transistor, that transistor Q8 will turn on and rapidly discharge the large gate capacitance of the switch JFET J11 at a rate determined by the IDSS of JFET J4, the amplification factor of transistor Q8, and the capacitance at the base node of transistor Q8. The capacitance of this node is quite small, since transistor Q8 and JFET J4 are constructed upon the same epitaxial island of the integrated circuit structure, as indicated by the dashed line enclosure 40 in FIG. 1. Transistor Q8 continues to discharge the gate node of JFET J11, until this large switch JFET J11 is conducting and its gate electrode is above the buffer output at the emitter of transistor Q9 by a voltage Vbe of transistor Q8, which is normally about 0.7 volts. The relatively small JFET J7 continues to discharge the gate electrode of JFET J11 until the gate-to-source voltage of transistor J11 is zero, or until the gate electrode and the source electrode are substantially at the same voltage. While the switch JFET J11 is on, J7 conducts only leakage currents, and acts as a resistor between the gate of JFET J11 and the buffer output at the emitter of transistor Q9, and keeps the gate voltage of JFET J11 substantially equal to the voltage of the source electrode so that the VGS of JFET J11 is 0, over the normal operating range of signals applied to the source electrode of JFET J11. Incidentally, the transient currents which flow as the switch is turning on are shown in FIG. 3 by the dashed lines and associated arrows.

Summarizing, the operation of the present circuit in the "switch-off" to "switch-on" transition is improved over that of prior circuits because it allows the discharge of the large gate capacitance of the switch JFET J11 at a fast rate during the transition, without idling a large current during the steady state condition while the switch JFET is turned on.

Figure 4:
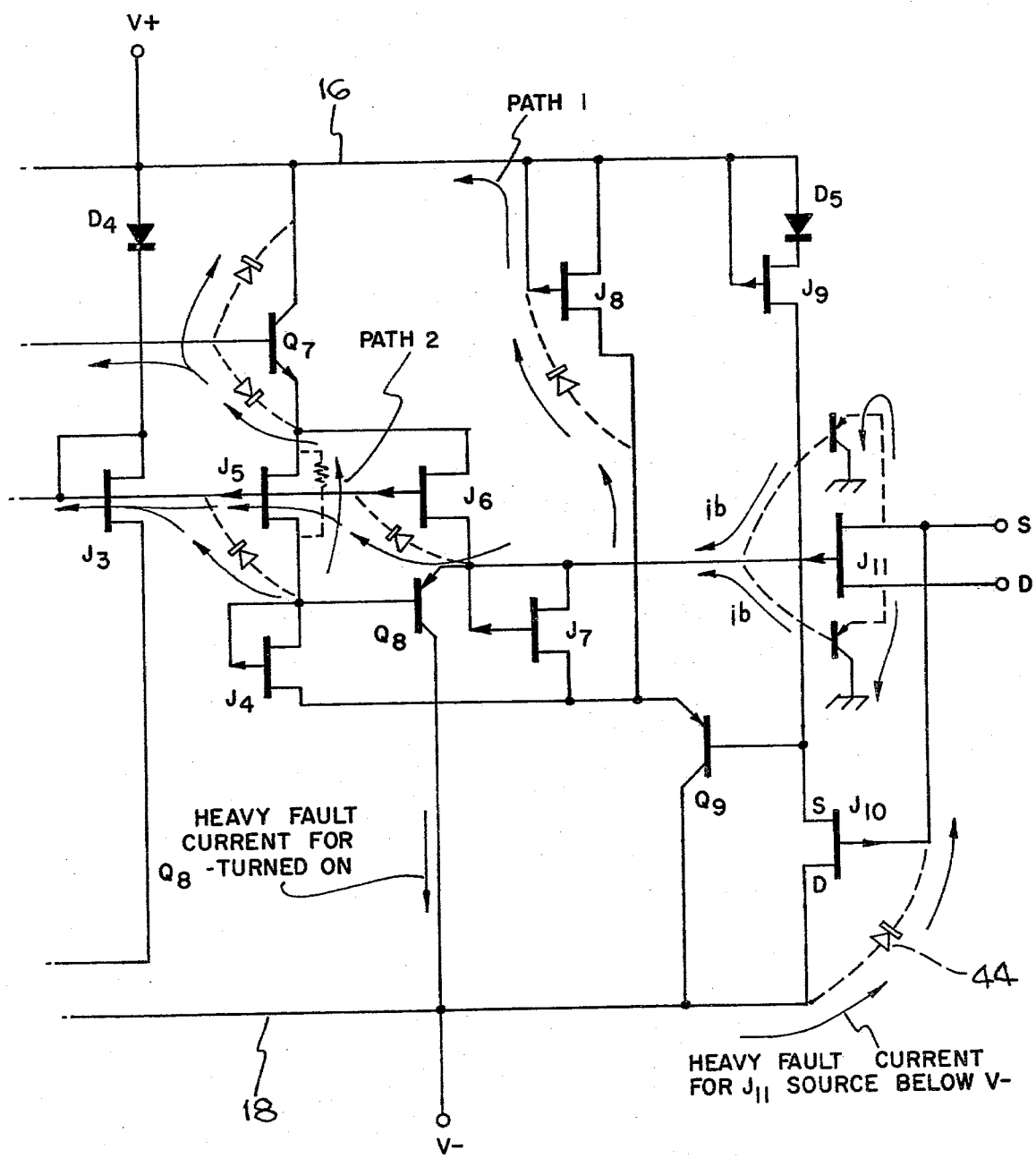
FIG. 4 is a partial circuit diagram showing possible fault current paths of the unprotected circuit.

Attention will now be directed to FIG. 4 and to fault currents which could flow if the circuit of FIG. 1 had not been modified to include certain protective arrangements, as discussed above. Incidentally, it may be noted that FIG. 4 is a somewhat simplified version of the right-hand portion circuit of FIG. 1.

The circuit of FIG. 4 could be employed without the supplemental fault protection elements as shown in FIG. 1 if there is no danger that voltages exceeding the specifications for the integrated circuit would be applied to the source and drain electrodes of JFET J11. Also, the circuit of FIG. 4 is of interest in showing the buffer output circuit and some of the other circuit components in a somewhat simplified form which may be more readily understood.

Now, proceeding to consider over-voltage protection, reference will be made to both FIG. 4 and 1, with FIG. 4 showing the unprotected circuit fault mode currents, and FIG. 1 showing the additional circuit elements which have been added to the circuit to protect against these fault mode currents.

The first fault mode which will be considered is that which arises when the source electrode of the switch J11, for example, is forced to a potential which is at least one diode drop, or one Vbe lower than the negative voltage supply. It may be recalled that the negative voltage supply is connected to the p-type substrate of the integrated circuit. The gate electrode is connected to the predominantly n-type epitaxial layer of the integrated circuit, and with the gate electrode normally at a more positive potential than the substrate, the effective diode between the epitaxial layer under each JFET and the substrate is back-biased, so no current flows. However, referring to FIG. 4 and JFET's J11 and J10, let us assume that a voltage of, for example, −20 volts is applied to the source electrode of JFET J11, with this source electrode being directly connected to the gate electrode of transistor J10 in the buffer circuit. With the drain electrode of JFET J10 being directly connected to the substrate at a negative 15 volts, and the gate electrode of J10 being at −20 volts, the usually back-biased diode indicated by reference numeral 44 in FIG. 4, becomes forward-biased, and heavy fault current may flow, and cause a parasitic lateral npn action between epitaxial islands of the integrated circuit.

To protect against this failure mechanism, a P-channel JFET, J14 as shown in FIG. 1 is added with its gate and source connected together and to the gate of JFET J10, and the drain of JFET J14 connected to the source of the switch JFET J11. Under normal operating conditions, the JFET J14 appears as a resistor in the gate of JFET J10. This has no effect on circuit function since no current normally flows in the gate circuit of JFET J10. When a negative over-voltage occurs, the current through the epitaxial-to-substrate diode under the gate electrode of JFET J10 is limited to the IDSS of JFET J14. The parasitic lateral npn action in the integrated circuit is further reduced by wide isolation around the epitaxial island including the JFET's J10 and J14, as indicated by the double dashed line circles 46 around these two components.

Now, with regard to another fault mode, if one of the switch contacts of JFET J11 is forced to a potential higher than the positive voltage supply, there are several possible fault currents to consider, and these are shown by the various arrows in FIG. 4 other than the arrow near the diode 44.

More specifically, current may flow directly through the JFET J11 and through the emitter-to-base path of the transistor Q8 back to a positive voltage supply bus 16. More specifically, the base current of transistor Q8 can take any or all of the three paths shown in FIG. 4, causing transistor Q8 to turn on and conduct heavy current to the substrate through the source (or drain)-to-gate diode of JFET J11. The parasitic vertical pnp transistor under JFET J11 could turn on with either transistor Q8 or the forward-biased drain-gate junction of JFET J6 providing a path for base current, which could also result in the flow of heavy fault current.

To solve this array of problems (with FIG. 4 showing the problems and FIG. 1 the solutions), two high voltage breakdown diodes D7 and D8 (lateral pnp transistors) are added to block base current paths of transistor Q8. A transistor, Q10, is also added and arranged to turn on when the source or drain electrodes of JFET J11 exceeds the positive voltage supply by 1 Vbe, or the voltage required to turn on a transistor at its base and emitter electrodes. This current through Q10 will satisfy all of the current requirements of the line that connects the collector of transistor Q4, the gate and source electrodes of JFET J3, the gate of JFET J5, and the gate of JFET J6, or clamp the source of the over-voltage. This will block the third fault current path in FIG. 4 and keep the current from flowing through the drain-gate junction of JFET J6.

Incidentally, with regard to prior work of others, it is understood that in certain discrete circuits, and that in certain integrated circuits which do not use a common substrate, resistors have been employed to limit fault currents; however, no circuits involving JFET switches or integrated circuits having a common substrate are known which utilize fault protection circuitry such as that disclosed herein.

In conclusion, it is to be understood that the circuit of FIG. 1 is merely illustrative of the principles of the present invention. Other semi-conductor components and arrangements may be employed to implement the functions as described hereinabove and specifically to form the circuitry by which initial higher current and subsequent lesser currents are permitted to flow and to implement the buffer circuit; and semiconductor circuits using devices of opposite polarity types could be employed, in compatible arrangements. Accordingly, it is to be understood that the present invention is not limited to the precise circuit as shown in FIG. 1.

What is claimed is:

1. A high current switching circuit comprising:
   a switch Junction Field Effect Transistor, or JFET, having a high current capacity;
   means for switching said switch JFET off rapidly and holding the gate electrode more than a "pinch-off" voltage beyond the normal source electrode voltage; said switching means including second JFET means of intermediate size for charging the gate capacitance of said switch JFET, and third JFET means of relatively small size in series with said second JFET means for limiting current flow after the gate capacitance of said switch JFET is charged while said switch JFET is off and for holding said switch JFET gate voltage more than a "pinch-off" beyond the normal source voltage.

2. A switching circuit as defined in claim 1 wherein said third JFET means includes two JFET's of different size, and transistor means connected between said two JFET's for discharging the gate capacitance of said switch JFET rapidly when it is turned on.

3. A high current switching circuit comprising:
   a switch Junction Field Effect Transistor, or JFET, having a high current capacity;

means for switching said switch JFET off rapidly and holding the gate electrode more than a "pinch-off" voltage beyond the normal source electrode voltage; said switching means including second JFET means of intermediate size for charging the gate capacitance of said switch JFET, and third JFET means of relatively small size in series with said second JFET means for limiting current flow after the gate capacitance of said switch JFET is charged while said switch JFET is off and for holding said switch JFET gate voltage more than a "pinch-off" beyond the normal source voltage;

said third JFET means includes two JFET's of different size;

transistor means connected between said two JFET's for discharging the gate capacitance of said switch JFET rapidly when it is turned on; and circuit means including the smaller of said two JFET's of different size for maintaining the gate electrode of said switch JFET substantially at the same potential as the source electrode of said switch JFET, without drawing excessive current.

4. A circuit as defined in claim 3 further comprising a unity gain buffer included as part of said circuit means for maintaining said gate and source electrodes of said switch JFET at substantially the same potential.

5. A switching circuit as defined in claim 3 including an integrated circuit chip having a common semiconductor substrate into which the circuit is incorporated and wherein an additional control JFET is provided with its drain electrode connected to the biased substrate of the integrated circuit, and the source of said switch JFET connected to the gate of said additional control JFET, whereby heavy fault currents could flow through said control JFET from the substrate in the event said switch JFET source electrode were shifted to a potential exceeding the biasing voltage applied to said substrate; wherein said circuit further comprises:

additional current limiting means connected in series between said switch and said control JFET to limit the fault current.

6. A circuit as defined in claim 5 wherein said current limiting means is another JFET having its source and gate electrodes connected together.

7. A high current switching circuit comprising:

a switch Junction Field Effect Transistor, or JFET, having a high current capacity;

means for switching said switch JFET off rapidly and holding the gate electrode more than a "pinch-off" voltage beyond the normal source electrode voltage; said switching means including semiconductor control means of intermediate size for charging the gate capacitance of said switch JFET, and current carrying means of relatively small size in series with said semiconductor control means for limiting current flow after the gate capacitance of said switch JFET is charged while said switch JFET is off and for holding said switch JFET gate voltage more than a "pinch-off" beyond the normal source voltage.

8. A high current switching circuit comprising:

a switch Junction Field Effect Transistor, or JFET, having a high current capacity;

unity gain buffer means connected to the switch electrode of said switch JFET for maintaining said gate and source electrodes of said switch JFET at substantially the same potential when said switch JFET is turned on;

first semiconductor means of relatively small current capacity interconnecting the output of said buffer with the gate electrode of said switch JFET; and second semiconductor means of relatively high current capacity connected between the gate electrode of said switch JFET and the power supply, for rapidly turning said switch JFET off and rapidly charging its gate capacitance, with the idle current through said second semiconductor means being channeled through said first semiconductor means to hold the idle current to a low level, while said switch JFET is turned off.

9. A high current switching circuit comprising:

a switch Junction Field Effect Transistor, or JFET, having a high current capacity;

unity gain buffer means connected to the switch electrode of said switch JFET for maintaining said gate and source electrodes of said switch JFET at substantially the same potential when said switch JFET is turned on;

first semiconductor means of relatively small current capacity for interconnecting the output of said buffer with the gate electrode of said switch JFET; and second semiconductor means of relatively high current capacity connected between the gate electrode of said switch JFET and the power supply, for rapidly turning said switch JFET off and rapidly charging its gate capacitance, with the idle current through said second semiconductor means being channeled through said first semiconductor means to hold the idle current to a low level, while said switch JFET is turned off;

said first semiconductor means including two JFET's of different size; and transistor means connected between said two JFET's of different size for discharging the gate capacitance of said switch JFET rapidly when it is turned on.

* * * * *